US008905775B2

(12) United States Patent
Yeh

(10) Patent No.: US 8,905,775 B2
(45) Date of Patent: Dec. 9, 2014

(54) ELECTRICAL CONNECTOR ASSEMBLY AND RETAINING DEVICE THEREOF

(71) Applicant: Hon Hai Precision Industry Co., Ltd., New Taipei (TW)

(72) Inventor: Cheng-Chi Yeh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 191 days.

(21) Appl. No.: 13/656,763

(22) Filed: Oct. 22, 2012

(65) Prior Publication Data

US 2013/0342997 A1 Dec. 26, 2013

(30) Foreign Application Priority Data

Jun. 25, 2012 (TW) .............................. 101212135 A

(51) Int. Cl.
*H01R 13/62* (2006.01)

(52) U.S. Cl.
USPC ........... 439/331; 439/485; 439/487; 361/709; 361/710; 361/704; 361/719; 165/185; 165/80.2; 165/80.3

(58) Field of Classification Search
CPC .................................................. H01L 23/4093
USPC .......... 439/331, 485, 487; 361/709, 710, 704, 361/719; 165/185, 80.2, 80.3
See application file for complete search history.

(56) References Cited

U.S. PATENT DOCUMENTS

| | | | |
|---|---|---|---|
| 5,302,853 A * | 4/1994 | Volz et al. ...................... 257/707 |
| 5,357,404 A * | 10/1994 | Bright et al. .................. 361/818 |
| 6,205,026 B1 * | 3/2001 | Wong et al. .................... 361/704 |
| 6,390,475 B1 * | 5/2002 | Eckblad et al. ................ 277/312 |
| 6,510,054 B1 * | 1/2003 | Chen .............................. 361/704 |
| 6,538,891 B1 * | 3/2003 | He et al. ......................... 361/704 |
| 6,574,109 B1 * | 6/2003 | McHugh et al. ............... 361/719 |
| 6,826,052 B2 | 11/2004 | Ma |
| 6,970,354 B2 * | 11/2005 | Villanueva et al. ....... 361/679.54 |
| 7,001,197 B2 * | 2/2006 | Shirai et al. ................... 439/331 |
| 7,133,285 B2 * | 11/2006 | Nishimura .................... 361/715 |
| 7,153,154 B2 * | 12/2006 | Ma et al. ........................ 439/331 |
| 7,203,066 B2 * | 4/2007 | Lee et al. ....................... 361/704 |
| 7,280,362 B2 * | 10/2007 | Hood et al. .................... 361/719 |
| 7,283,362 B2 * | 10/2007 | Lin et al. ........................ 361/704 |
| 7,327,575 B2 * | 2/2008 | Yu et al. ......................... 361/719 |
| 7,385,823 B1 * | 6/2008 | Desrosiers et al. ........... 361/710 |
| 7,388,751 B2 * | 6/2008 | Hood et al. .................... 361/704 |
| 7,493,937 B2 * | 2/2009 | Chen et al. .................... 165/80.2 |
| 7,667,972 B2 * | 2/2010 | Chen et al. .................... 361/709 |
| 7,690,926 B2 * | 4/2010 | Yeh et al. ......................... 439/73 |
| 7,699,637 B2 * | 4/2010 | Yeh ................................ 439/331 |
| 7,766,691 B2 * | 8/2010 | Pandey et al. ................. 439/487 |
| 7,773,384 B2 * | 8/2010 | Lin et al. ........................ 361/719 |
| 7,824,188 B2 * | 11/2010 | Yokoyama ....................... 439/73 |

(Continued)

*Primary Examiner* — David M Sinclair
*Assistant Examiner* — Robert Brown
(74) *Attorney, Agent, or Firm* — Wei Te Chung; Ming Chieh Chang

(57) ABSTRACT

An retaining device of an electrical connector assembly for use with a heat dissipating device, includes a first retainer, a fixing lever, and a second retainer. The fixing lever has one end pivotally mounted to the first retainer and another end capable of locked by the first retainer. The second retainer is integral formed with an elastic plate. The first retainer and the second retainer are two separated members, and the fixing lever and the elastic plate are used for pressing two opposite ends of the heat dissipating device.

20 Claims, 5 Drawing Sheets

(56) References Cited

U.S. PATENT DOCUMENTS

| | | | |
|---|---|---|---|
| 7,826,229 B2* | 11/2010 | Cromwell et al. | 361/719 |
| 7,828,577 B2* | 11/2010 | Yeh | 439/331 |
| 7,841,883 B2* | 11/2010 | Yeh | 439/330 |
| 7,867,006 B2* | 1/2011 | Yeh | 439/331 |
| 7,990,718 B2* | 8/2011 | Xia et al. | 361/710 |
| 8,052,451 B2* | 11/2011 | Yeh | 439/331 |
| 8,052,452 B2* | 11/2011 | Yeh et al. | 439/331 |
| 8,081,477 B2* | 12/2011 | Yang et al. | 361/720 |
| 8,137,121 B2* | 3/2012 | Dai | 439/135 |
| 8,192,220 B2* | 6/2012 | Yeh | 439/331 |
| 8,439,693 B2* | 5/2013 | Yeh et al. | 439/135 |
| 8,693,200 B2* | 4/2014 | Colgan et al. | 361/702 |
| 2004/0018755 A1* | 1/2004 | Ma | 439/73 |
| 2004/0257771 A1* | 12/2004 | Shinotou | 361/704 |
| 2005/0030718 A1* | 2/2005 | Villanueva et al. | 361/710 |
| 2005/0083659 A1* | 4/2005 | Gattuso et al. | 361/704 |
| 2005/0094379 A1* | 5/2005 | Lee et al. | 361/719 |
| 2005/0111191 A1* | 5/2005 | Lee et al. | 361/704 |
| 2005/0111193 A1* | 5/2005 | Lee et al. | 361/704 |
| 2006/0056152 A1* | 3/2006 | Li et al. | 361/697 |
| 2006/0141840 A1* | 6/2006 | Ma | 439/331 |
| 2006/0291169 A1* | 12/2006 | Lee et al. | 361/704 |
| 2007/0025084 A1* | 2/2007 | Tang | 361/704 |
| 2007/0103870 A1* | 5/2007 | Li et al. | 361/704 |
| 2007/0230136 A1* | 10/2007 | Chen | 361/719 |
| 2007/0232113 A1* | 10/2007 | Ho | 439/331 |
| 2007/0297131 A1* | 12/2007 | Hood et al. | 361/687 |
| 2007/0297143 A1* | 12/2007 | Martinson et al. | 361/719 |
| 2008/0239677 A1* | 10/2008 | Coleman et al. | 361/719 |
| 2008/0280474 A1* | 11/2008 | Fan et al. | 439/266 |
| 2008/0298022 A1* | 12/2008 | Li | 361/710 |
| 2009/0203245 A1* | 8/2009 | Chiang | 439/331 |
| 2009/0325404 A1* | 12/2009 | Lin et al. | 439/73 |
| 2010/0002396 A1* | 1/2010 | He et al. | 361/709 |
| 2010/0093201 A1* | 4/2010 | Yeh | 439/330 |
| 2010/0120268 A1* | 5/2010 | Yeh | 439/68 |
| 2010/0130030 A1* | 5/2010 | Liao et al. | 439/68 |
| 2010/0130049 A1* | 5/2010 | Yeh et al. | 439/331 |
| 2010/0184308 A1* | 7/2010 | Yeh | 439/65 |
| 2010/0184314 A1* | 7/2010 | Yeh | 439/157 |
| 2010/0259902 A1* | 10/2010 | Xia et al. | 361/720 |
| 2010/0321894 A1* | 12/2010 | Wang et al. | 361/709 |
| 2011/0149520 A1* | 6/2011 | Yang | 361/709 |
| 2011/0157833 A1* | 6/2011 | Bohannon et al. | 361/709 |
| 2011/0157835 A1* | 6/2011 | Feng et al. | 361/718 |
| 2011/0249404 A1* | 10/2011 | Chiu | 361/704 |
| 2011/0294330 A1* | 12/2011 | Dai | 439/331 |
| 2012/0045941 A1* | 2/2012 | Yeh | 439/626 |
| 2012/0156919 A1* | 6/2012 | Yeh et al. | 439/370 |
| 2012/0162923 A1* | 6/2012 | Lee et al. | 361/719 |
| 2012/0327606 A1* | 12/2012 | Tang | 361/720 |
| 2013/0003302 A1* | 1/2013 | Tan et al. | 361/704 |
| 2013/0050946 A1* | 2/2013 | Ma et al. | 361/709 |
| 2013/0078827 A1* | 3/2013 | Yeh et al. | 439/76.1 |
| 2013/0153190 A1* | 6/2013 | Gan | 165/185 |

* cited by examiner

ELECTRICAL CONNECTOR ASSEMBLY AND RETAINING DEVICE THEREOF

BACKGROUND OF THE INVENTION

1. Field of the Invention

The present invention relates to a electrical connector assembly, and more particularly to the electrical connector assembly having a retaining device to retain a heat dissipating device.

2. Description of Related Art

As we all known, Central Processing Unit (CPU) will generate a great deal of heat during operation, so a heat dissipating device is needed to transmit heat thereof. U.S. Pat. No. 6,826,052 issued to Ma on Nov. 30, 2004 discloses a heat sink retaining assembly including a retaining module and a pair of clips. Two retaining portions are respectively formed on each of two opposite sidewalls of the retaining module. Bifurcated block portions are integrally formed on interior faces of each of four sidewalls of the retaining module. A gap is defined between each block portion and its corresponding sidewall, and each gap receives a resilient member. Each resilient member includes a guide portion and a pressing portion. A heat sink is received in the retaining module via the guide portions. The heat sink is restricted by the pressing portions from sliding in lateral directions relative to the retaining module. The clips are engaged with the retaining portions. The heat sink is thereby securely fastened to the retaining module and to an associated CPU package.

However, the two clips of Ma assembled to the retaining module need operation two same times, respectively, clearly, it's trouble and waste of time.

Therefore, an improved electrical connector assembly with a retaining device is needed.

SUMMARY OF THE INVENTION

An object of the present invention is to provide an electrical connector assembly having a retaining device to retain a heat dissipating device conveniently and saving time.

According to one aspect of the present invention, a retaining device of an electrical connector assembly for use with a heat dissipating device, comprises a first retainer, a fixing lever, and a second retainer. The fixing lever has one end pivotally mounted to the first retainer and another end capable of locked by the first retainer. The second retainer is integral formed with an elastic plate. The first retainer and the second retainer are two separated members, the fixing lever and the elastic plate are used for pressing two opposite ends of the heat dissipating device.

According to another aspect of the present invention, an electrical connector assembly for use with a heat dissipating device, comprises an electrical connector, a first retainer, a fixing lever, and a second retainer. The heat dissipating device is mounted upon the electrical connector. The fixing lever has one end pivotally mounted to the first retainer and another end capable of locked by the first retainer. The second retainer is integral formed with an elastic plate. The first retainer and the second retainer are two separated members, the fixing lever and the elastic plate are used for pressing two opposite ends of the heat dissipating device.

Other objects, advantages and novel features of the invention will become more apparent from the following detailed description of a preferred embodiment when taken in conjunction with the accompanying drawings.

DETAILED DESCRIPTION OF THE INVENTION

Figure 1:
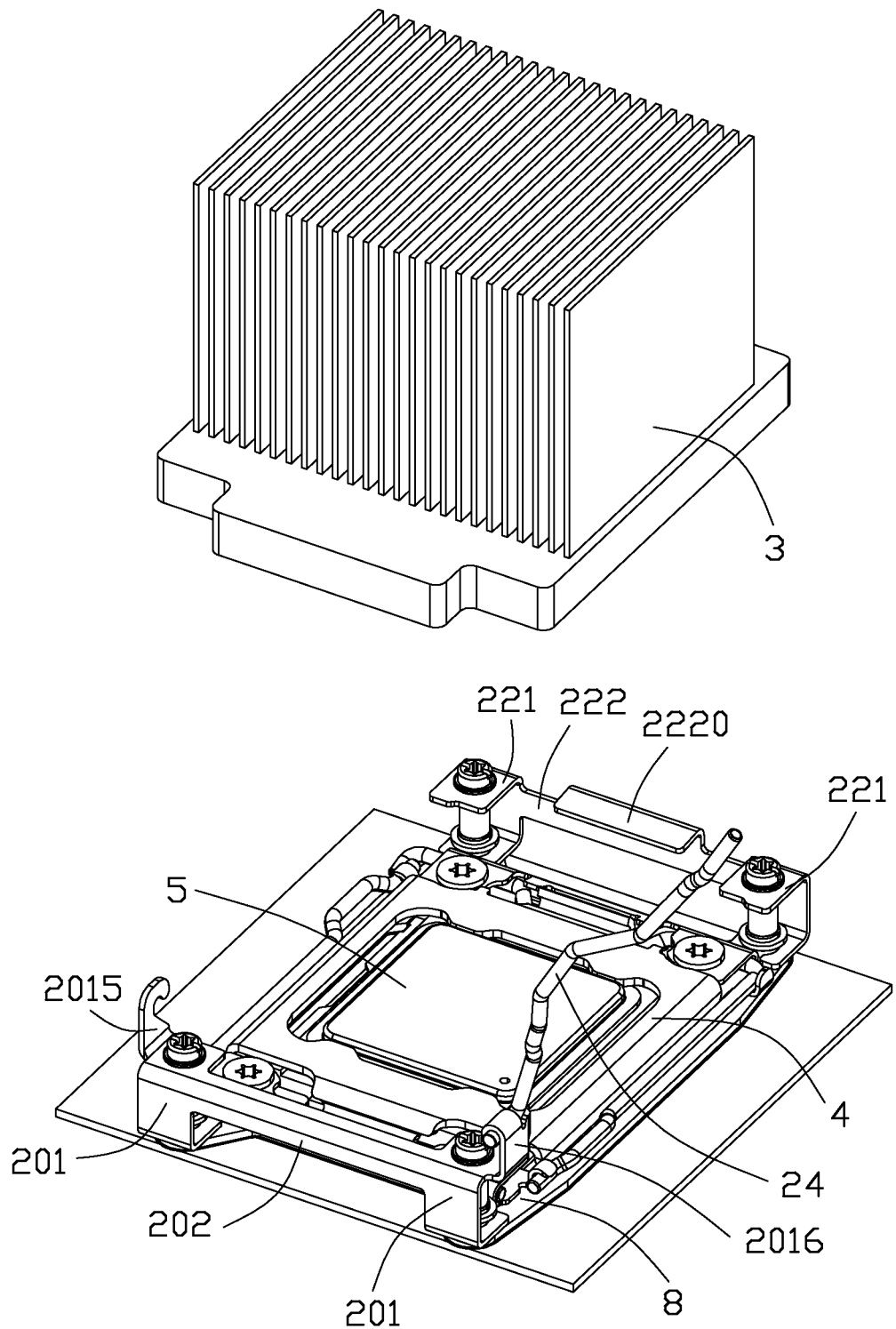
FIG. 1 is an assembled, perspective view of an electrical connector assembly in accordance with the present invention, and a heat dissipating device is prepare to assemble the electrical connector assembly.
Figure 2:
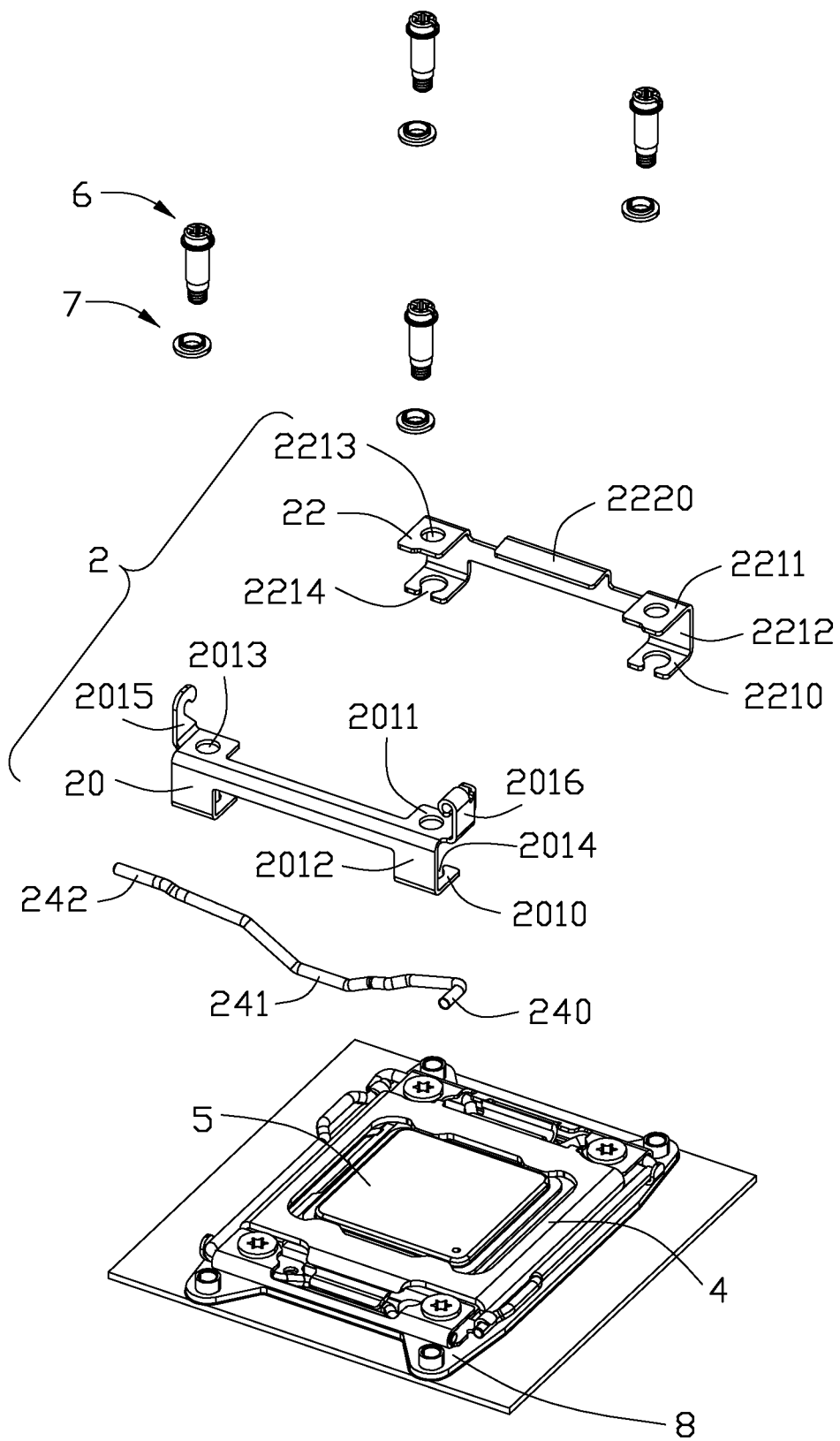
FIG. 2 is a perspective view of the electrical connector assembly, while the retaining device does not assemble to an electrical connector of the electrical connector assembly.
Figure 3:
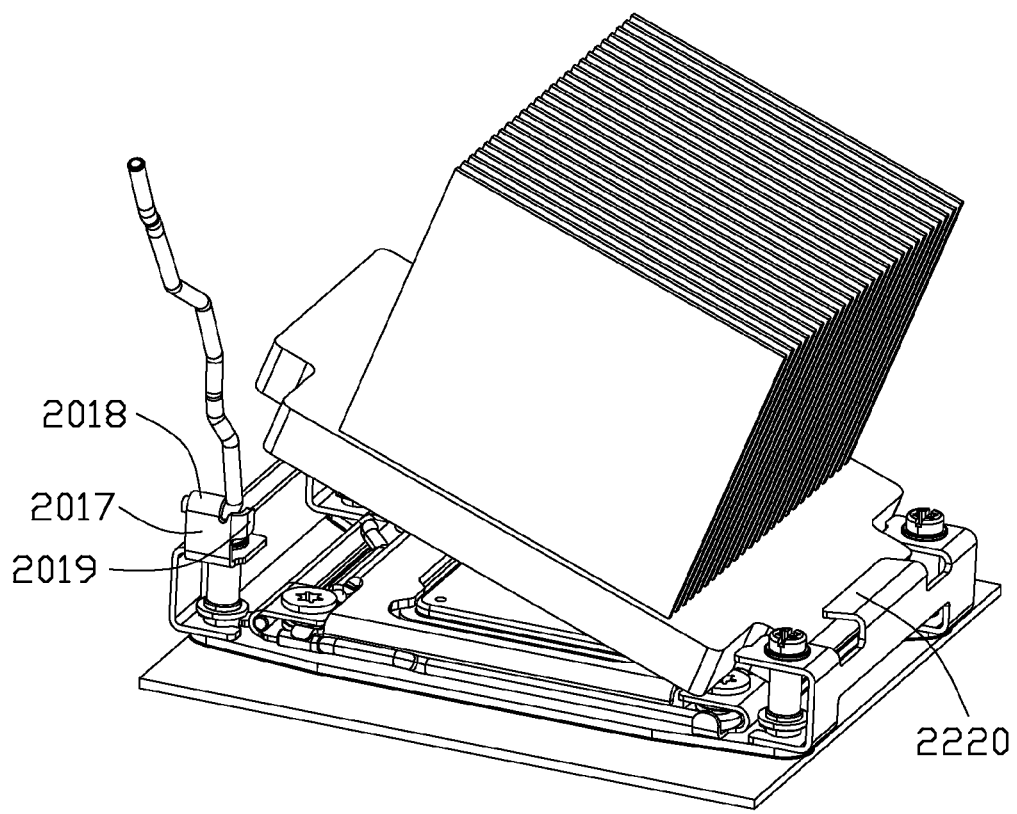
FIG. 3 is an assembled view of the electrical connector assembly, showing the heat dissipating device being assembling to the electrical connector assembly.

Referring to FIGS. 1 and 3, an electrical connector assembly comprises an electrical connector 4 and a retaining device 2, the retaining device 2 used for retaining a heat dissipating device 3 to the electrical connector 4.

Referring to FIG. 1, the electrical connector 4 includes an insualtive housing, a plurality of contacts received in the insulative housing, a pair of levers mounted to a stiffener, and a cover pivotally mounted to one of the levers. The electrical connector 4 is for used with an electronic package 5.

The retaining device 2 includes a first retainer 20 located at one end of the electrical connector 4, a second retainer 22 located opposite to the first retainer 20, and a fixing lever 24 mounted to the first retainer 20. The first retainer 20 and the second retainer 22 with different shapes are formatted of sheet metal stamping.

The first retainer 20 comprises two first mounting portions 201 and a first connecting portion 202 to connect the two first mounting portions 201. The first mounting portion 201 includes a horizontal bottom plate 2010, a top plate 2011 parallel to the bottom plate 2010, and a vertical plate 2012 connecting the bottom plate 2010 and the top plate 2011. The top plate 2011 defines a through hole 2013 to allow a screw 6 passing thereof and the bottom plate 2010 defines an opening 2014 to pre-locate a nut 7, wherein the screw 6 and the nut 7 connect with each other in a vertical direction. The first connecting portion 202 connects the two top plates 2011 and the two vertical plates 2012 for increase the strength of the top plates 2011.

A hook 2015 is disposed on one side of the top plate 2011 of the first mounting portion 201. A shaft-supporting 2016 is formed on another side of the top plate 2011 of another first mounting portion 201. The shaft-supporting 2016 includes a vertical main body 2017, a bent portion 2018 bent inwardly from a top end of the main body 2017, and a stopper portion 2019 extending from a side of the main body 2017 and positioned in one side of the bent portion 2018. The fixing lever 24 is mounted in the bent portion 2018 and restricted by the stopper portion 2019.

The second retainer 22 similar with the first retainer 20, comprises two second mounting portions 221 and a second connecting portion 222 connecting with the two first portions 221. The second mounting portion 221 also comprises a bottom plate 2210 with aperture 2214, a top plate 2211 with a through hole 2213, and a vertical plate 2212 connecting the bottom plate 2210 and the top plate 2211. The second connecting portion 222 connects the two vertical plates 2212 of the two second mounting portions 221. An elastic plate 2220 extends integrally from a top end of the second connecting portion 222 toward to the first retainer 20 and inclined downwardly from a root to a free end to provide a spring force to press the heat dissipating device 3.

The fixing lever 24 includes a receiving end 240 mounted in the bent portion 2018, a pressing portion 241 positioned lower than the bent portion 2018 in a vertical direction for pressing the heat dissipating device 3, and a locked portion 242 locked by the hook 2015 of the first retainer 20.

The first retainer 20 and the second retainer 22 are secured to the base plate 8 by the nuts 7. The nuts 7 and the screws 6 are further locked together by interference, that make the top plate 2011, 2211 move slightly downward to generate a tensile stress to avoid long-term use, and temperature cycling to cause the screws 6 loose.

Figure 4:
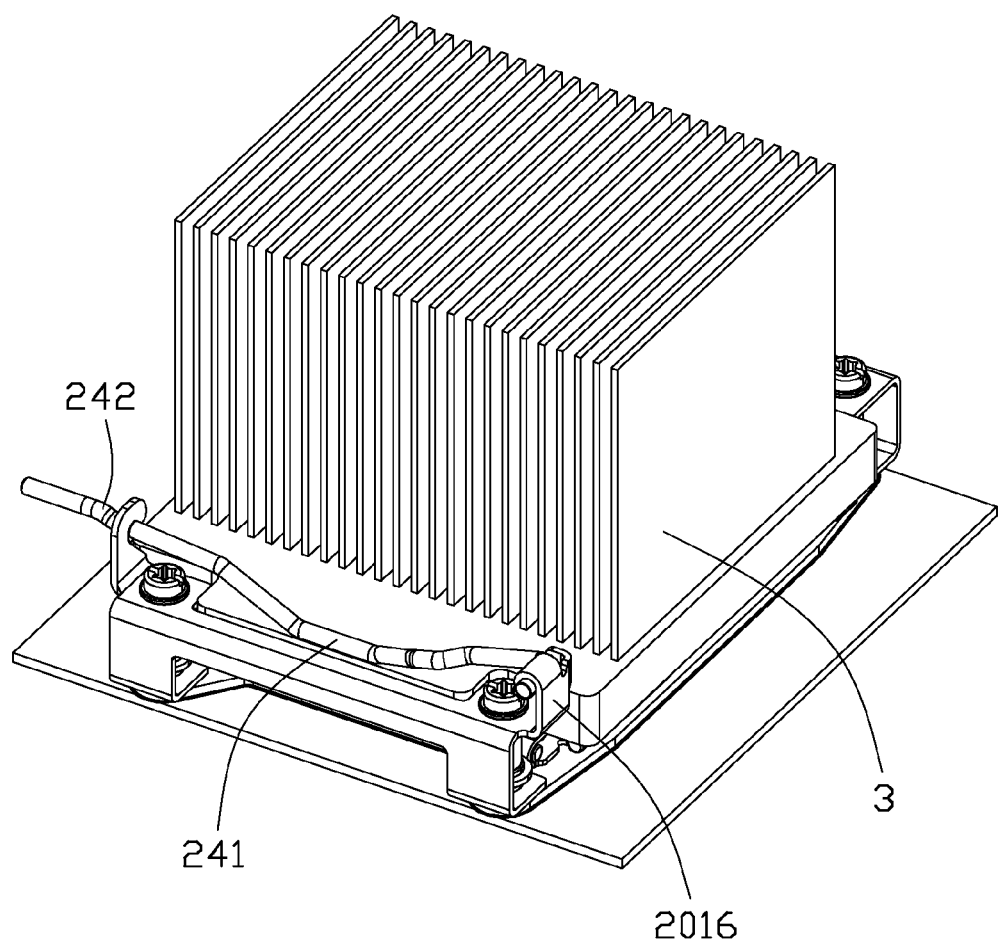
FIG. 4 is an assembled view of the electrical connector assembly assembled with the heat dissipating device.
Figure 5:
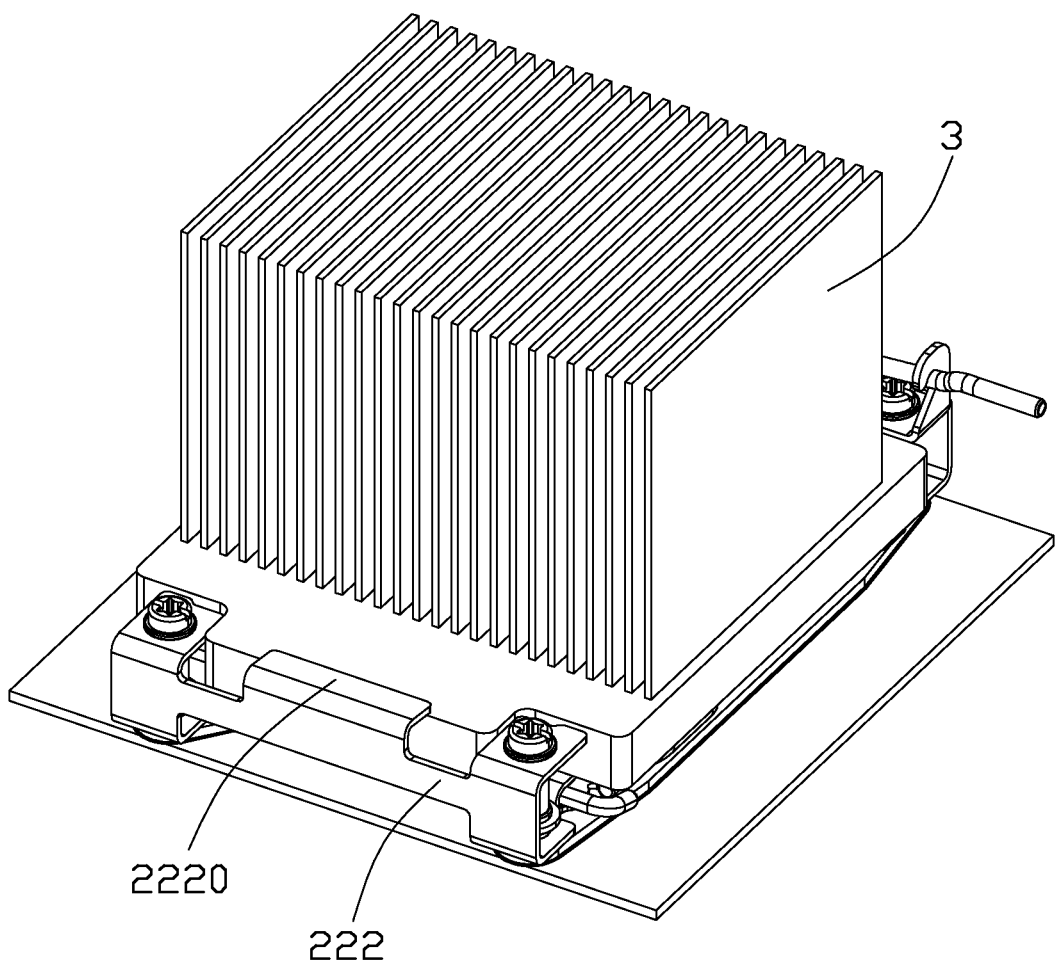
FIG. 5 is similar to FIG. 4, but taken from another side.

Referring to FIGS. 3 to 5, the top plates 2011, 2211 of the first retainer 20 and the second retainer 22 are higher than the highest point of the electrical connector 4, and in the present invention, that is higher than the cover of the electrical connector 4 when the electrical connector assembly is assembled together. During using the electrical connector assembly, one end of the heat dissipating device 3 is inclined inserted into a bottom of the elastic plate 2220 of the second retainer 22, then rotates the heat dissipating device 3 located upon the electrical connector assembly with the electronic package 5, last rotates the fixing lever 24 to make the pressing portion 241 to press another end of the heat dissipating device 3 and make the locked portion 242 locked by the hook 2015 of the first retainer 20. In the prevent invention, using the pressing portion 241 and the elastic plate 2220 common press the heat dissipating device 3 so that the heat dissipating device 3 engages with the electronic package 5 and dissipating the heat generated thereof.

The apertures 2014, 2214 of the bottom plates 2010, 2210 of the first retainer 20 and the second retainer 22 are non-closed holes to convenient pre-locate the nuts 7. If the apertures 2014, 2214 are closed hole, the diameters of the apertures 2014, 2214 need smaller than that of the nuts 7 for the first and the second retainers 20, 22 can pre-locate to the base plate 8 by the nuts 7, otherwise, the nuts 7 can not pre-locate the first and the second retainers 20, 22.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A retaining device of an electrical connector assembly for use with a heat dissipating device, comprising:
   a first retainer;
   a fixing lever having one end pivotally mounted to the first retainer and another end capable of being locked by the first retainer;
   a second retainer integrally formed with an elastic plate; and wherein
   the first retainer and the second retainer are two separated members, the fixing lever and the elastic plate are used for pressing two opposite ends of the heat dissipating device.

2. The retaining device as claimed in claim 1, wherein the elastic plate extends toward the first retainer and inclined downwardly from a root to a free end to provide a reciprocal force.

3. The retaining device as claimed in claim 1, wherein the first retainer has a shaft-supporting on one end to receive the fixing lever and a hook on another end to lock the fixing lever.

4. The retaining device as claimed in claim 3, wherein the shaft-supporting includes a main body extending upwardly in a vertical direction, a bent portion extending inwardly from a top of the main body, and a stopper portion extending from a side of the main body.

5. The retaining device as claimed in claim 4, wherein the first retainer has a first mounting portion and the second retainer has a second mounting portion, and wherein the first mounting portion and the second mounting portion both define top plates with through holes, bottom plates with apertures, and vertical plates connecting the top plates and the bottom plates.

6. The retaining device as claimed in claim 5, wherein the apertures are non-closed holes.

7. The retaining device as claimed in claim 5, wherein the shaft-supporting and the hook are designed on two opposite ends of the top plates of the first mounting portions.

8. The retaining device as claimed in claim 5, wherein the first retainer includes two first mounting portions and a first connecting portion connecting the two top plates and the two vertical plates; and the second retainer includes two second mounting portions and a second connecting portion connecting the two vertical plates.

9. The retaining device as claimed in claim 5, wherein the elastic plate is designed at a middle of the second connecting portion of the second retainer.

10. The retaining device as claimed in claim 1, wherein the first retainer and the second retainer are both made of sheet metal stamping.

11. An electrical connector assembly for use with a heat dissipating device, comprising:
    an electrical connector, a heat dissipating device mounted upon the electrical connector;
    a first retainer;
    a fixing lever having one end pivotally mounted to the first retainer and another end capable of being locked by the first retainer;
    a second retainer integrally formed with an elastic plate; and wherein
    the first retainer and the second retainer are two separated members, the fixing lever and the elastic plate are used for pressing two opposite ends of the heat dissipating device.

12. The electrical connector assembly as claimed in claim 11, wherein the first retainer has a shaft-supporting on one end to receive the fixing lever and a hook on another end to lock the fixing lever, the shaft-supporting includes a main body extending upwardly in a vertical direction, a bent portion extending inwardly from a top of the main body, and a stopper portion extending from a side of the main body.

13. The electrical connector assembly as claimed in claim 11, wherein the elastic plate extends toward the first retainer and inclined downwardly from a root to a free end to provide a reciprocal force.

14. The electrical connector assembly as claimed in claim 11, wherein the first retainer includes two first mounting portions and a first connecting portion connecting the two top plates and the two vertical plates; and the second retainer includes two second mounting portions and a second connecting portion connecting the two vertical plates.

15. The electrical connector assembly as claimed in claim 14, wherein the top plates of the first mounting portions and the second mounting portions are higher than the highest point of the electrical connector.

16. An electrical connector assembly for use with a heat sink defining first and second retention areas at two opposite ends, comprising:
    an electrical connector, for holding an electronic package thereon, defining a rectangular configuration in a top view with thereof longitudinal and transverse directions perpendicular to each other;

a heat sink retainer including first and second clips disposed by two opposite longitudinal ends of the connector, respectively, in said longitudinal direction, each of said first and second clips essentially extending in said transverse direction, the first clip defining a stationary elastic plate for holding first retention area of the heat sink, the second clip defining a moveable fixing lever for holding the second retention area of the heat sink; wherein said stationary elastic plate defines a pivotal region thereunder for allowing the first retention area to be associated therewith in a pivotal manner during assembling the heat sink to the heat sink retainer, and the moveable fixing lever may be moved initially to an unlocking position for allowing the second retention area to be downwardly moved toward around the second clip, and sequentially to a locking position to downwardly press the second retention area.

17. The electrical connector assembly as claimed in claim 16, wherein said moveable fixing lever is moveable in a rotational manner.

18. The electrical connector assembly as claimed in claim 17, wherein the moveable fixing lever is rotated about an axis located at one end of the second clip and extending in a longitudinal direction.

19. The electrical connector assembly as claimed in claim 16, wherein each of said first and second clips defines a U-shaped configuration in a side view to provide resiliency thereof in a vertical direction perpendicular to both said longitudinal direction and said transverse direction.

20. The electrical connector assembly as claimed in claim 16, wherein each of said first and second clips includes a pair of screws at two opposite ends in said transverse direction for securing the corresponding clip with regard to the connector.

* * * * *